United States Patent
Fender et al.

(10) Patent No.: US 9,698,794 B1
(45) Date of Patent: Jul. 4, 2017

(54) SYSTEMS AND METHODS FOR COALESCING REGIONS ON A VIRTUALIZED PROGRAMMABLE LOGIC DEVICE

(71) Applicant: Altera Corporation, San Jose, CA (US)

(72) Inventors: Joshua David Fender, East York (CA); Benyamin Siman-Tov, Pleasanton, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/978,033

(22) Filed: Dec. 22, 2015

(51) Int. Cl.
*H03K 19/177* (2006.01)
*G06F 7/38* (2006.01)
*G06F 3/06* (2006.01)

(52) U.S. Cl.
CPC ....... *H03K 19/1776* (2013.01); *G06F 3/0604* (2013.01); *G06F 3/0629* (2013.01); *G06F 3/0638* (2013.01); *G06F 3/0647* (2013.01); *G06F 3/0673* (2013.01); *H03K 19/17756* (2013.01); *H03K 19/17796* (2013.01)

(58) Field of Classification Search
None
See application file for complete search history.

(56) References Cited

U.S. PATENT DOCUMENTS

| | | | |
|---|---|---|---|
| 8,046,446 B1* | 10/2011 | Karr ..................... | H04L 67/1097 709/223 |
| 8,912,820 B2* | 12/2014 | Huang ................ | G06F 17/5054 326/38 |
| 2008/0036488 A1* | 2/2008 | Kelem ................ | G06F 15/7867 326/10 |
| 2016/0049941 A1* | 2/2016 | How ..................... | H03K 19/007 326/9 |

* cited by examiner

Primary Examiner — Douglas W Owens
Assistant Examiner — James H Cho
(74) Attorney, Agent, or Firm — Fletcher Yoder, P.C.

(57) ABSTRACT

Systems and methods for coalescing regions on a virtualized programmable logic device are provided. A first function is configured on a first subregion on the virtualized programmable logic device. The first subregion may border an unused subregion on the programmable logic device. The first function operated on the first subregion is migrated to a second function operated on a second subregion on the virtualized programmable logic device by mapping a first set of bits configuring the first subregion to a second set of bits configuring the second subregion for the second function. The first subregion is then released from the first function. The second function is configured to perform a same task with the first function, and the first subregion and the unused subregion together form a larger unused subregion on the virtualized programmable logic device. Similarly, multiple subregions can be migrated and vacated to form a larger available region.

19 Claims, 8 Drawing Sheets

SYSTEMS AND METHODS FOR COALESCING REGIONS ON A VIRTUALIZED PROGRAMMABLE LOGIC DEVICE

FIELD OF THE INVENTION

This invention relates to resource allocation in a virtualized programmable logic circuit environment.

BACKGROUND OF THE INVENTION

Hardware can be virtualized in such a way that an application executes on the virtualized hardware, instead of the physical hardware. For example, for a virtual memory, pages of memory are swapped in and out a computing system, allowing applications to address a much larger memory than the actual physical memory. Similarly, a reconfigurable computing system can swap in and out portions of the hardware by a reconfiguration process, allowing applications to effectively use more hardware than physically exists. For example, two different applications can independently execute on a hardware processor via different virtual interfaces as if the hardware processing capacity has been increased. The capacity of the virtualized hardware, however, can be limited when the physical hardware has been overly fragmented, because an available fragment of the physical hardware may not provide sufficient physical resources to accommodate a new application.

SUMMARY OF THE INVENTION

In accordance with embodiments of the present invention, space defragmentation on a running virtualized reconfigurable logic circuit such as a virtualized programmable logic device is implemented to coalesce available subregions on the programmable logic device.

Therefore, in accordance with embodiments of the present invention, the coalescing of regions on a virtualized programmable logic device is provided. A first function is configured on a first subregion on the virtualized programmable logic device. The first subregion borders an unused subregion on the programmable logic device. The first function operated on the first subregion is migrated to a second function operated on a second subregion on the virtualized programmable logic device. The first subregion is then released from the first function. The second function is configured to perform a same task with the first function, and the first subregion and the unused subregion forms a larger unused subregion on the virtualized programmable logic device.

In accordance with another embodiment of the present invention there is provided systems and methods for migrating a function operating on a subregion to a different subregion in a virtualized programmable logic environment. A first function associated with a first subregion is determined to be migrated to a second subregion on a programmable logic device. A second function can be loaded to the second subregion on the programmable logic device, and the second function can be configured to perform a same task with the first function. State information associated with the first function can be transferred to the second function, and the first subregion is released. The first subregion and the unused subregion form a larger unused subregion on the programmable logic device.

As used in this description, and in the claims which follow, the adjectives "first" and "second," when applied to "function" or "subregion," are intended solely as identifiers to distinguish one function from another function, or one subregion from another subregion, and are not intended to be ordinal, unless explicitly indicated.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Unless otherwise indicated, the discussion that follows will be based on an example of a programmable integrated circuit device such as a field-programmable gate array (FPGA). However, it should be noted that the subject matter disclosed herein may be used in any kind of programmable device.

In accordance with embodiments of the present invention, region defragmentation on a virtualized programmable logic device, such as a virtualized FPGA, is implemented to free up larger available subregions on the FPGA. Part of the defragmentation can be realized via FPGA live region migration.

Figure 2:
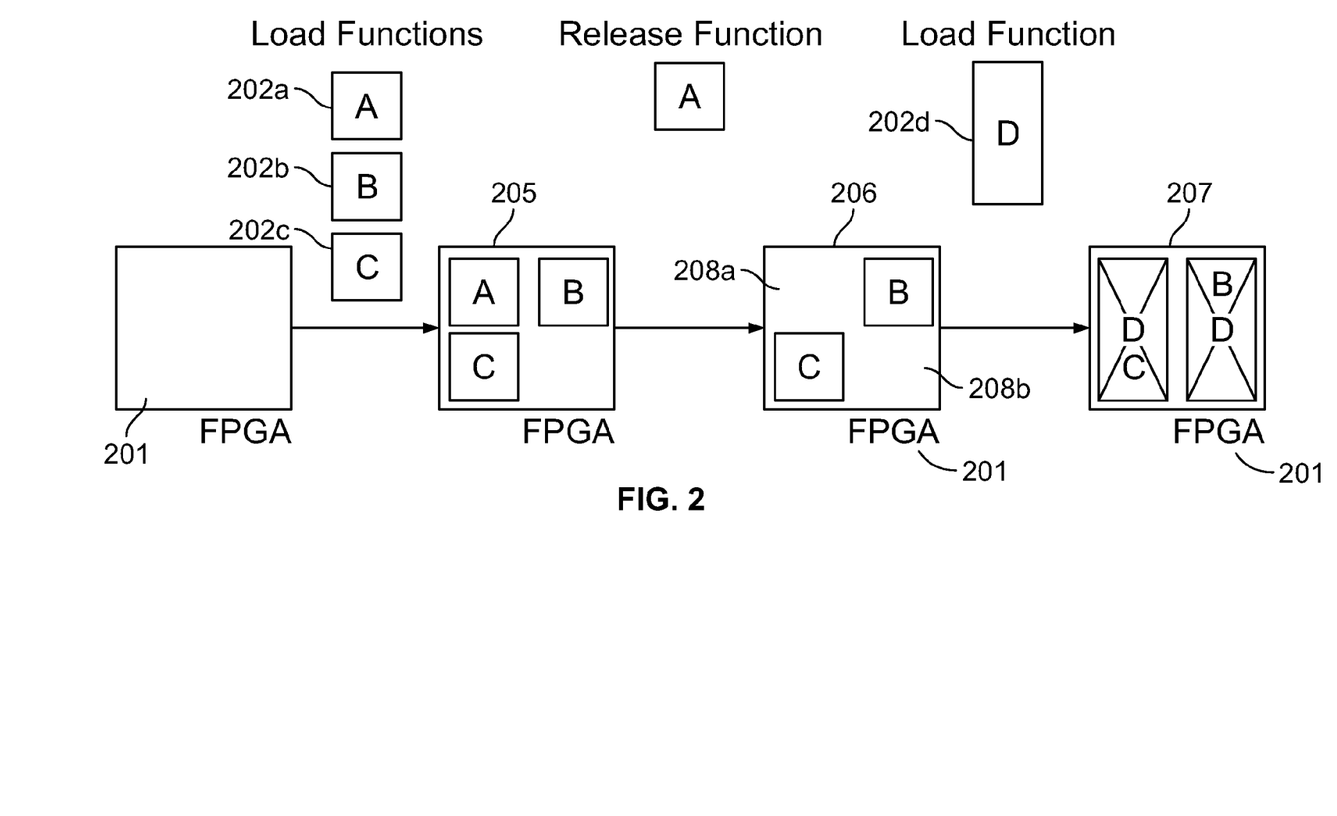
FIG. 2 provides an example block diagram illustrating a scenario in which fragmentation in a virtualized FPGA may prevent dynamic loading of new functions.

For example, in a virtualized FPGA environment, when multiple new functions are dynamically loaded and released from subregions of the FPGA, space fragmentation can occur on the FPGA (e.g., as further illustrated in FIG. 2). Such fragmentation may prevent the dynamic loading of a new function when there is not a large enough contiguous region for the new function. Thus, defragmentation via region migration (e.g., as further illustrated in FIG. 3) can be implemented to release and coalesce adjacent subregions such that the coalesced subregions can provide sufficient resources for the new function for the virtualized FPGA.

Figure 1:
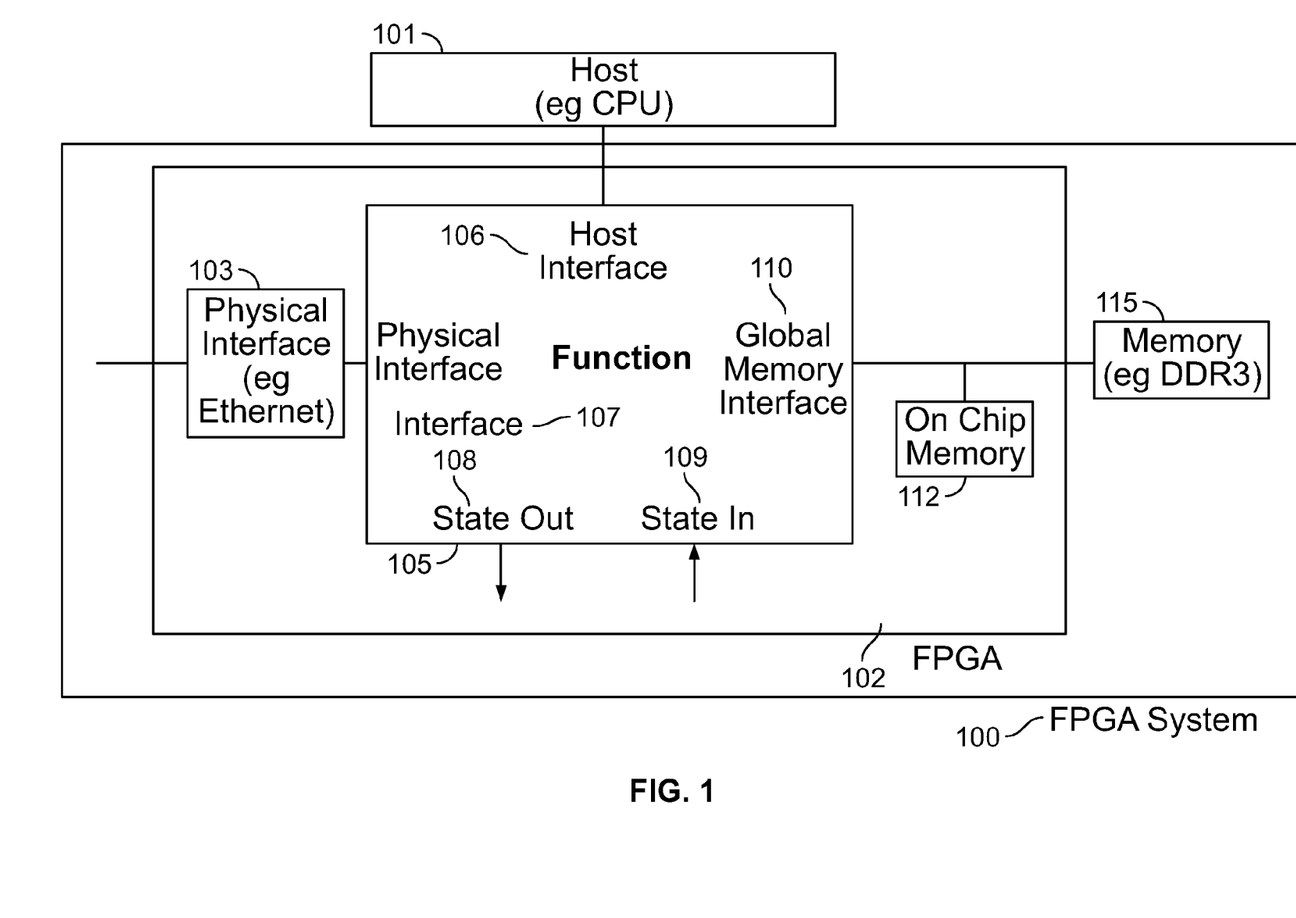
FIG. 1 shows an example block diagram illustrating an example FPGA system 100 running as a virtualized FPGA environment.

FIG. 1 shows an example block diagram illustrating an example FPGA system 100 running as a virtualized FPGA environment. The FPGA system 100 may include an FPGA fabric 102, which is connected to an external memory unit 115 (e.g., a Double-Data-Rate Type 3 Synchronous Dynamic Random-Access Memory (DDR3 SDRAM), etc.), and a host processor 101 (e.g., a central processing unit (CPU)). The FPGA 102 can receive instructions, and read or write data from or to the memory 115. The host 101 can control the FPGA 102 to execute a function based on the instructions loaded from the memory 115.

On the physical FPGA fabric, e.g., the FPGA 102, a physical interface 103 can connect the FPGA 102 to an external component such as the Ethernet. The FPGA 102 may also include an on-chip memory 112 such that frequently used data or instructions can be temporarily stored for fast data retrieval, without having to performing a read/write operation with the external read/write operation with the memory 115.

A physical portion of the FPGA fabric 102, e.g., a region, can be configured to perform a specific task. The configured region or a set of configured regions is herein referred to as a "function," e.g., see 105. The function 105 can physically include multiple interfaces to connect to other logic components on the FPGA 102. For example, a global memory interface 110 provides access to memory accessible to one or more functions on the FPGA 102. The host interface 106 provides a communication channel between the function 105 with the host 101. The interface component 107 for the physical interface provides an interface connecting the function 105 with a physical input/output interface medium, such as an Ethernet connector.

The function 105 may include a "state-out" output port 108 for streaming out internal state information associated with the function 105 and a "state-in" input port 109 for receiving state information that can be used to migrate the function 105 to a new subregion. Further discussion of transferring state information to migrate a function from one subregion to another subregion is provided in connection with FIG. 5.

The FPGA 102 can be virtualized such that the same physical region for the function 105 can be shared or reused to execute different tasks, as if multiple functions are generated out of the same physical region. To achieve this, the interface(s) (e.g., 103) to the FPGA can be virtualized. For example, on a physical FPGA, the I/O pins of the FPGA are used to communicate with outside circuits; in virtualized FPGAs, interfaces are virtualized between FPGA (e.g., 102) and a system (e.g., the host 101). For instance, with the virtualized interfaces to a physical FPGA fabric, two different applications may independently operate on the same function built on the same region of the FPGA via different virtual interfaces. For example, when the physical hardware is able to handle 10 units of processing task but a single application only uses 5 units, by using virtualized interfaces to allow two applications to operate on the same physical hardware, the entire 10 units of processing task of the physical hardware can be utilized. Thus the ability to utilize the functional capability of the same region of the FPGA is enhanced by virtualization.

FIG. 2 provides an example block diagram illustrating a scenario in which fragmentation in a virtualized FPGA may prevent dynamic loading of new functions. When new functions A-C (202a-c) are loaded onto the virtualized FPGA 201, the new functions A-C may take up subregions of the FPGA as shown at 205. When function A is released, functions B-C may remain on the FPGA 201, taking up subregions as shown at 206. Here, free space fragmentation may occur, e.g., while subregions 208a-b are free, they are fragmented, instead of forming an available contiguous region. When a new function D (202d) is to be loaded onto the FPGA 201, the fragmented FPGA, e.g., at 207, cannot provide an available region large enough for function D.

Figure 3:
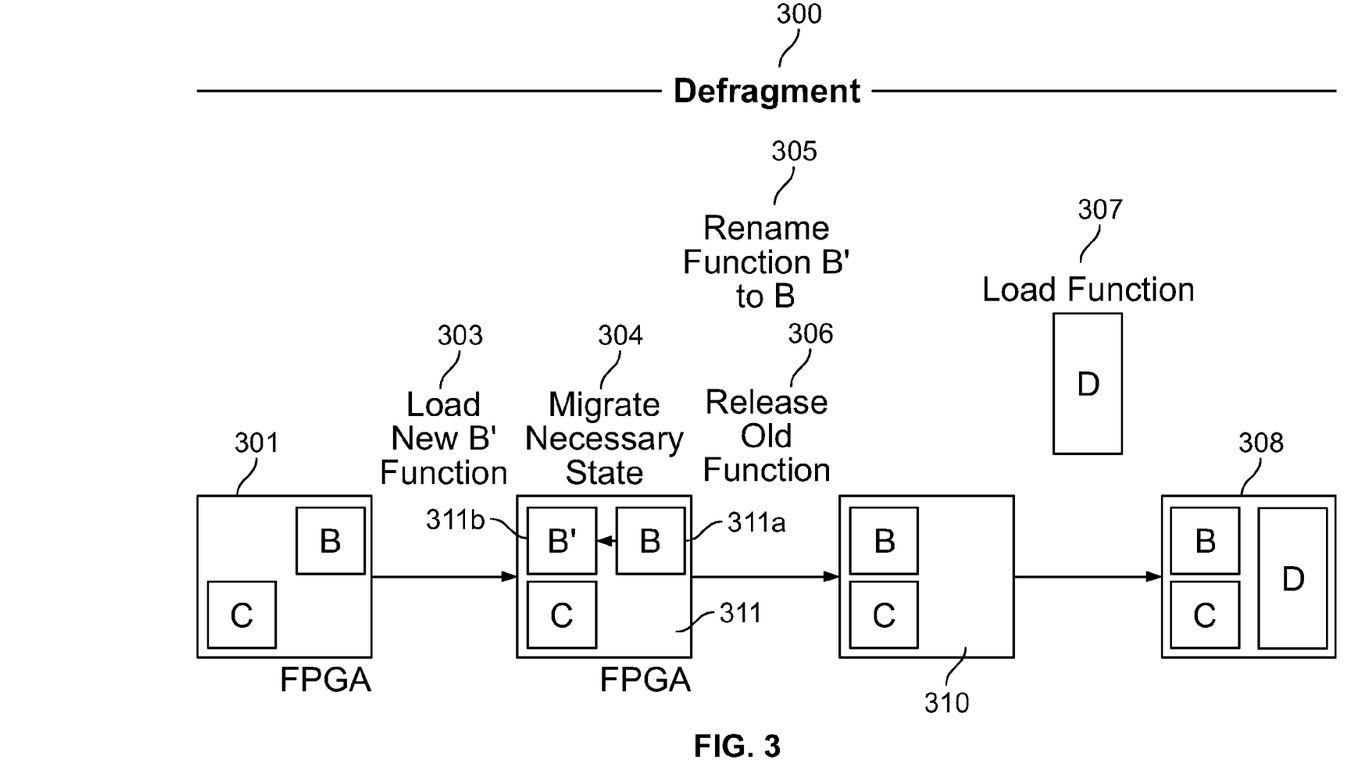
FIG. 3 provides an example block diagram illustrating region defragmentation 300 of a running virtualized FPGA system using live region migration within the FPGA.

FIG. 3 provides an example block diagram illustrating region defragmentation 300 of a running virtualized FPGA system using live region migration within the FPGA. At 301, which is similar to the fragmented FPGA 206 in FIG. 2 after function A has been released, defragmentation can be implemented by migrating function B to a new region such that the original subregion associated with function B can be released to coalesce with other available subregions. To achieve this, a new function B' can be loaded at 303, which may be configured to perform a similar task as function B. The new function B' can take up a previously fragmented space (e.g., 208a in FIG. 2).

For example, to load the new function B' for an FPGA system as shown at 311, a configuration bitstream can be provided to the FPGA region to configure the region to realize a given function. In one implementation, such configuration bitstream can be precompiled to match the resources available in a specific region, e.g., the region for a specific function B 311a. Multiple bitstreams can be provided for a given function to correspond to different regions into which the given function can be placed if necessary on the FPGA fabric. As shown at FPGA 311, a same function (e.g., an accelerator) can be associated with multiple different configuration bitstreams, each of which represents that the same function is to be executed at a different subregion.

The functions can be moved from the subregion of function B 311a to a new subregion as function B' 311b. For example, the FPGA system can respond to a request to move function B 311a from its original subregion to a new subregion at 311b by looking up a corresponding configuration bitstream that has been precompiled to implement for a same function as the function B but to be placed at the new subregion, referred to as function B', and then loading the corresponding configuration bitstream in the FPGA at the subregion location 311b. Because the corresponding configuration bitstream for function B' can implement the same function as the original function B 311a, function B' has the ability to accept state from the original function B 311a. Alternatively, the new function B' 311b can be configured to perform additional functions in addition to the same function that function B 311a performs.

In an alternative implementation, the configuration bitstream can be remappable from the subregion of function B 311a to the subregion of function B' 311b. For example, an agent (e.g., a device or a system that employs or operates with an FPGA managing the FPGA can have a remap block that maps the bits configuring function B at the subregion 311a to bits that can be programmed in another function B' at the subregion 311b to perform the same function. Such mapping can be implemented in either hardware or software. For example, the mapping can include a one-to-one remapping table of a bitstream for function B at subregion 311a corresponding to another bitstream for function B' at subregion 311b. The agent can read bits out of function B 311a, and remap the bits through the remapping table. The remapped bits can then be used to configure the subregion 311b for function B'.

In both ways, either with a precompiled region-specific bitstream or a region-remappable bitstream, an FPGA function can be moved to a different location on the FPGA fabric while preserving the same function to be performed.

Continuing on with 304 in FIG. 3, the FPGA may then use function B' at subregion 311b to replace function B at subregion 311a. For example, the FPGA can migrate necessary states from function B to function B', such that function B' may inherit all the configuration information and runtime state information from function B.

Upon state migration, the FPGA can rename function B' as function B at 305, and release the old function B at 306. Thus, a defragmented free space 310 on the FPGA has been formed. When a new function D 307 is loaded to the FPGA, now the FPGA has a large enough contiguous region to load function D, as shown at 308. It is noted that in FIG. 3, for illustrative purpose only, subregion 311a borders an unused subregion so that when subregion 311a is released, the subregion 311a can form a larger unused region with the unused subregion to load function D 307. In another example, multiple subregions that may or may not border a previously unused subregion can be migrated and released in order to make subregions available for defragmentation, e.g., to form a larger available region.

Figure 4:
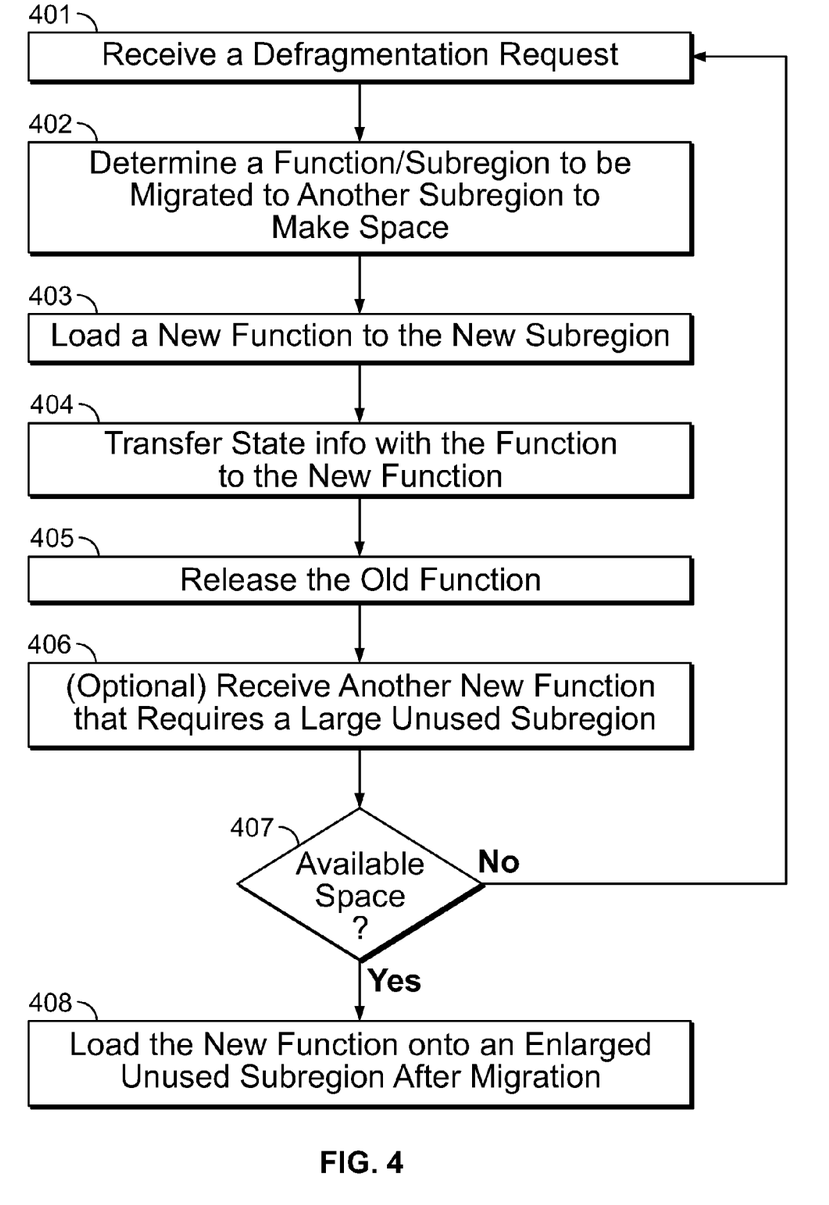
FIG. 4 provides an example logic flow diagram illustrating aspects of region defragmentation within FPGA live region migration.

FIG. 4 provides an example logic flow diagram illustrating aspects of region defragmentation within FPGA live region migration. At 401, the FPGA system may receive a defragmentation request. For example, migration can be triggered by an external request received from outside the FPGA system. Or alternatively, the request can be generated within the FPGA, e.g., in response to a new function loading request when the FPGA does not have a large enough contiguous region (e.g., at 407). In another implementation, the defragmentation can be implemented periodically, constantly or intermittently on the FPGA.

At 402, the FPGA system can determine a function operated on a subregion on the FPGA to be migrated to another subregion to make free space. The old subregion may border a free subregion such that a larger unused subregion can be created when the old subregion is released. Or alternatively, the old subregion may not directly border a free subregion but instead borders another subregion that borders the free subregion. In this case, functions on the old subregion and the other subregion can both be migrated to eventually allow the two subregions to be coalesced with the free subregion. Or alternatively, functions on one or more subregions that do not border a free subregion can be migrated to a different location, and the resulting vacant subregions can be combined to form a large-enough free region. In any case, the old, or "first" subregion, and the other, or "second," subregion, can be migrated in any temporal order.

At 403, a new function can be loaded to the new subregion. The new function can be the same as, or be configured to perform a same task as the old function such that the new function can replace the old function. At 404, the FPGA system can transfer state information associated with the old function to the new function. The old function can then be released at 405 to free up the old subregion.

If the FPGA system receives another new function that requires a large unused subregion at 406, the system may determine at 407, whether the FPGA has sufficient available space. If a large-enough subregion has been formed when the old subregion is released to connect with an adjacent free subregion, the system at 408, can load the new function to the large subregion. Otherwise, if no large-enough subregion is available, the system may generate a defragmentation request and repeat similar procedures at 401-405 to generate a larger unused subregion.

Figure 5:
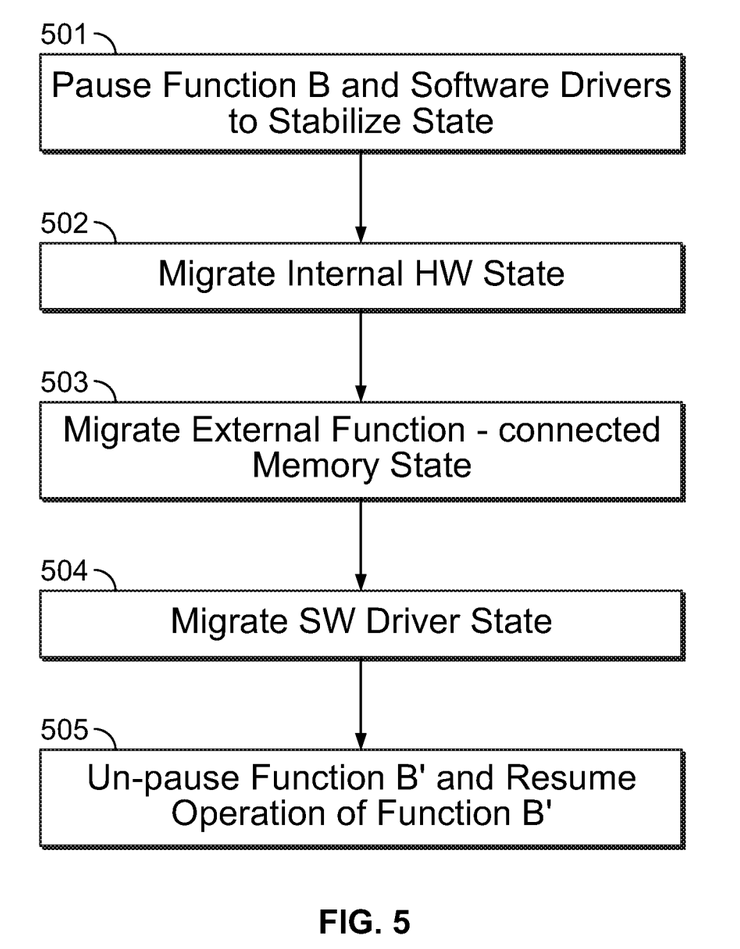
FIG. 5 provides an example logic flow diagram illustrating migrating states in a virtualized FPGA.

FIG. 5 provides an example logic flow diagram illustrating migrating states in a virtualized FPGA. The FPGA usually has two types of states, including static configuration information (e.g., routing, logic, etc.) and a runtime state (e.g., register values, on-chip RAM status, off-chip RAM status, etc.). Thus when a FPGA is loading new functions, static states and dynamic states are transferred via the state I/O ports (e.g., 108-109 in FIG. 1) to a region on the FPGA fabric. Hardware or software drivers can have physical-region-specific states that require remapping.

To migrate states from one region to another, at 501, the FPGA system can pause the old function, e.g., function B (e.g., see 311a in FIG. 3) and the respective software drivers to stabilize the state information associated with function B. For example, a physical interface that function B depends on can be put into a pause state through the means of a pause request interface during the migration process. Software application programmable interfaces (APIs) can implement the pause in software and/or hardware interfaces to inform a function of pause (e.g., via an explicit signal, or a part of the state-transfer-out signal).

At 502, the FPGA system may migrate an internal hardware state from one region to the new region, and then migrate a memory state associated with an external function at 503. For example, the internal hardware state at 502 may include flip-flop values and on-chip RAMS. In another example, the FPGA system may be connected to an off-chip device that has state information, such as, but not limited to an off-chip ternary content-addressable memory (TCAM) memory. Such state information from the connected off-chip device is also part of the internal hardware state information. The external memory state at 503 can include state information from any type of memory accessible by the function but external to the function itself, e.g., see memory 112 or 115 in FIG. 1. Subsequently, the FPGA system may optionally migrate a software driver state at 504, and then un-pause the new function B' (e.g., see 311b in FIG. 3) and resume the function with the new function B'. The software driver state may include anything stored in a processor-attached RAM, local storage devices, remote databases or services, that is related to the FPGA function. For example, the software driver state can include data structures stored in an FPGA virtual memory subsystem, and/or the like. In some implementations, the software driver can be written in a way such that there is no need to transfer the software driver state to the new function B'.

For example, migrating an internal state may be implemented by the FPGA system signaling the hardware for function B to stream an internal state out using a state stream interface (e.g., see 108 in FIG. 1). Or alternatively, migrating an internal state can be implemented by asking function B's software driver to stream the internal state out using a software API. In this case, the FPGA system may optionally remap the streamed internal state using a function-specific remapping function to a usable state associated with function B' at the new subregion. The FPGA system may then signal the hardware to stream the state, which may have been remapped, into accelerator B' or ask the software driver to stream the state in using a software API.

Figure 6:
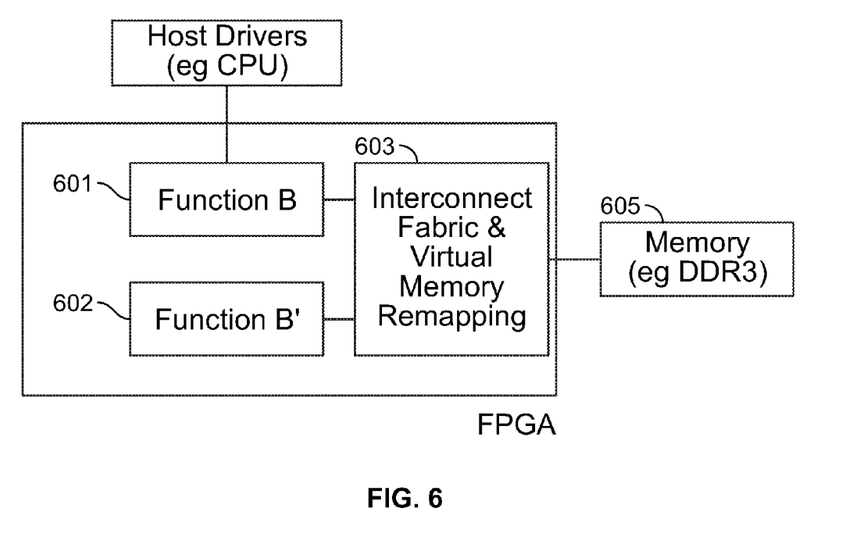
FIG. 6 provides an example block diagram illustrating aspects of the FPGA structure for migrating a function-connected memory state.

FIG. 6 provides an example block diagram illustrating aspects of the FPGA structure for migrating a function-connected memory state. In the external memory element 605, the function B 601 may maintain a memory segment, and the function B' 602 may maintain a memory segment. One way to migrate the memory state associated with function B 601 to be associated with function B' 602 can be to copy the memory segment associated with function B 601 to the memory segment associated with function B' 602 in the external memory unit 605.

Alternatively, via a more efficient approach, the FPGA system can utilize a connection fabric 603 with virtual addressing to connect function B' 602 to the memory and address space previously used by function B 601 in the external memory unit 605. The interconnect and virtual memory remapping fabric 603 can include a multi-port front end fabric, such as but not limited to the QSYS Avalon® interconnect from Altera Corporation, of San Jose, Calif. In this way, the memory is not physically migrated but rather remapped to be accessible from the newly assigned subregion through the means of a hardware addressing remapping function. Virtual memory address translation can be segment-based, paged-based, and/or the like.

Figure 7:
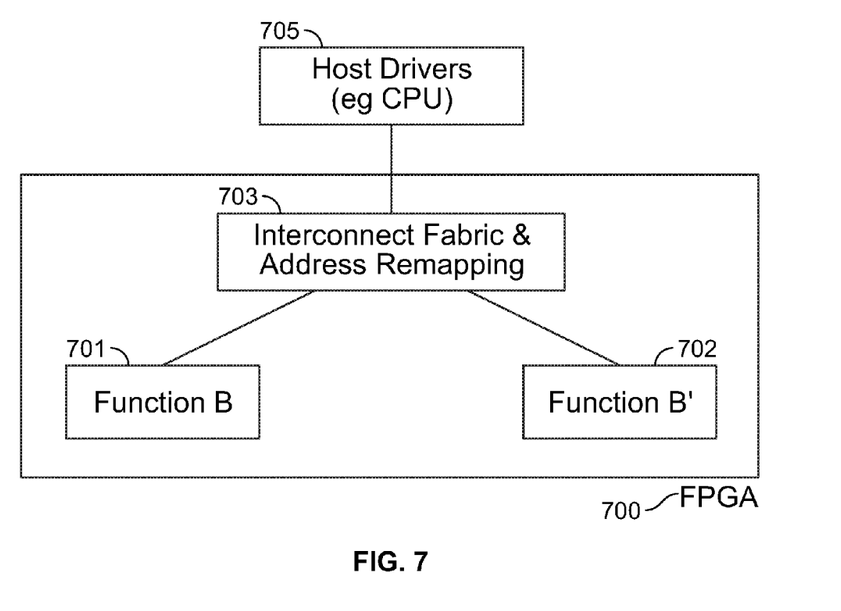
FIG. 7 provides an example block diagram illustrating aspects of the FPGA structure for migrating a software driver state via host driver state remapping.

FIG. 7 provides an example block diagram illustrating aspects of the FPGA structure for migrating a software driver state via host driver state remapping. An interconnect fabric 703 can be used to connects function B 701 and a host driver 705 (e.g., a CPU), and also can be used to connect function B' 702 and the host driver 705. The host driver state remapping process can be performed by the interconnect fabric 703 via address remapping. In one implementation, the FPGA system and the state migration process can be structured such that there is no region-specific state in the driver that needs remapping. The FPGA 700 contains interconnect fabric 703 that connects host drivers 705 to specific slots such as functions B and B' 701-702. The migration process can pause the host driver 705, disconnect the interconnect 703 from function B 701, change the interconnect to connect to function B' 702 and restart the host driver 705.

In an alternative implementation, to realize host driver state remapping, the FPGA system can inform the host driver 705 that a migration event is occurring though a specified API. Such an API includes platform-specific information indicating where the new function is located such that the host driver 705 can communicate with it once the host driver is un-paused. For example, the host-function interface at 703 can be blocked during migration, and then be remapped to point to the function B' 702 once the migration is complete. Blocking and remapping can happen in hardware on the FPGA or through external means (such as a software layer).

Figure 8:
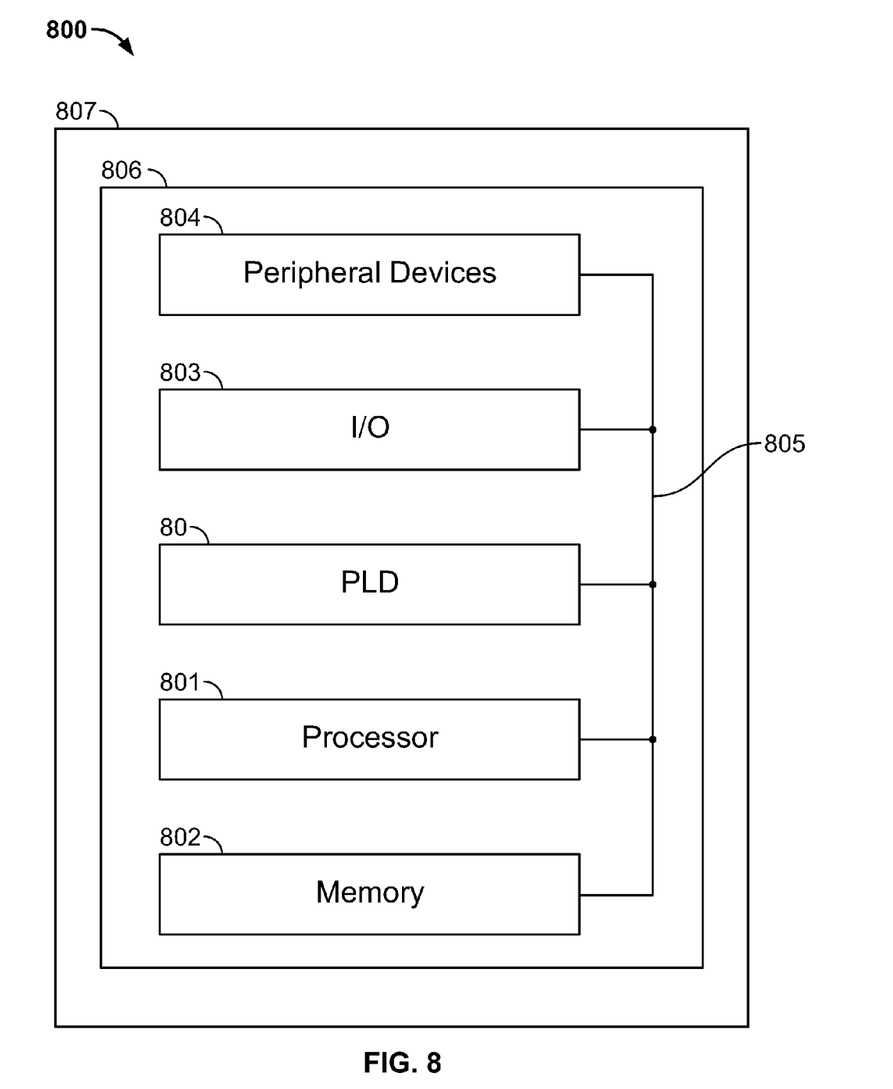
FIG. 8 is a simplified block diagram of an exemplary system employing a programmable logic device incorporating the present invention.

FIG. 8 is a simplified block diagram of an exemplary system employing a programmable logic device incorporating the present invention. A PLD 80 such as an FPGA, that is configurable according to the present invention may be used in many kinds of electronic devices. One possible use is in an exemplary data processing system 800 shown in FIG. 8. Data processing system 800 may include one or more of the following components: a processor 801; memory 802; I/O circuitry 803; and peripheral devices 804. These components are coupled together by a system bus 805 and are populated on a circuit board 806 which is contained in an end-user system 807.

System 800 can be used in a wide variety of applications, such as computer networking, data networking, instrumentation, video processing, digital signal processing, Remote Radio Head (RRH), or any other CPU offload application where the advantage of using programmable or reprogrammable logic is desirable. PLD 80 can be used to perform a variety of different logic functions. For example, PLD 80 can be configured as a processor or controller that works in cooperation with processor 801. PLD 80 may also be used as an arbiter for arbitrating access to shared resources in system 800. In yet another example, PLD 80 can be configured as an interface between processor 801 and one of the other components in system 800. It should be noted that system 800 is only exemplary, and that the true scope and spirit of the invention should be indicated by the following claims.

Various technologies can be used to implement PLDs 80 as described above and incorporating this invention.

Figure 9:
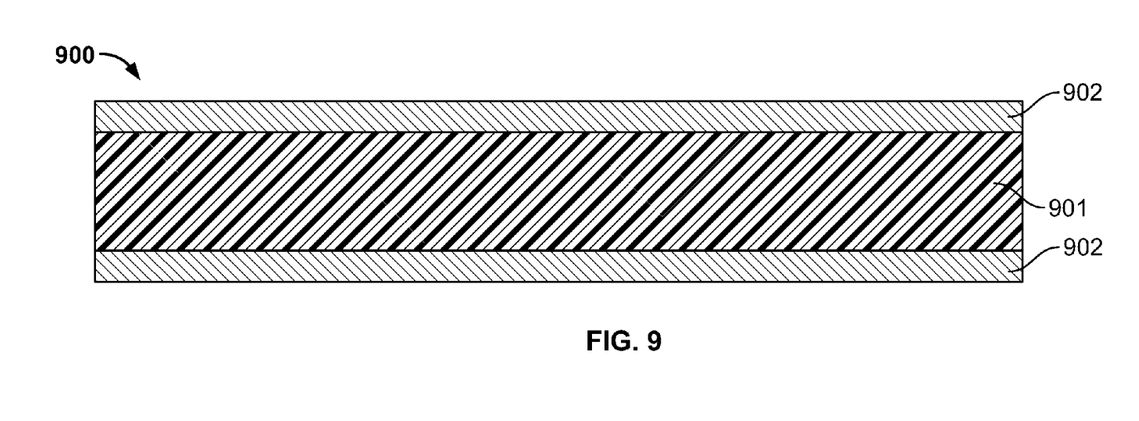
FIG. 9 presents a cross section of a magnetic data storage medium 900 which can be encoded with a machine executable program that can be carried out by systems such as the aforementioned personal computer, or other computer or similar device.

FIG. 9 presents a cross section of a magnetic data storage medium 900 which can be encoded with a machine executable program that can be carried out by systems such as the aforementioned personal computer, or other computer or similar device. Medium 900 can be a floppy diskette or hard disk, or magnetic tape, having a suitable substrate 901, which may be conventional, and a suitable coating 902, which may be conventional, on one or both sides, containing magnetic domains (not visible) whose polarity or orientation can be altered magnetically. Except in the case where it is magnetic tape, medium 900 may also have an opening (not shown) for receiving the spindle of a disk drive or other data storage device.

The magnetic domains of coating 902 of medium 900 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 10:
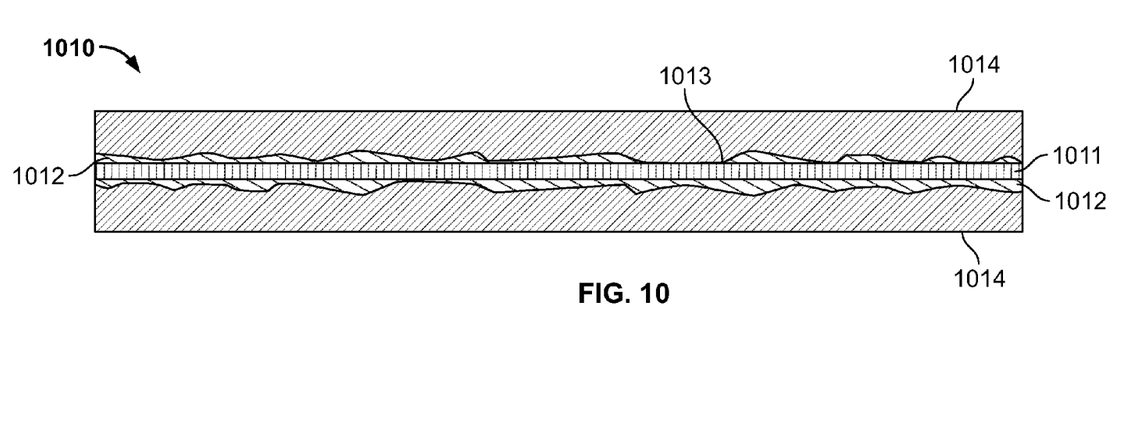
FIG. 10 shows a cross section of an optically-readable data storage medium 1010 which also can be encoded with such a machine-executable program, which can be carried out by systems such as the aforementioned personal computer, or other computer or similar device.

FIG. 10 shows a cross section of an optically-readable data storage medium 1010 which also can be encoded with such a machine-executable program, which can be carried out by systems such as the aforementioned personal computer, or other computer or similar device. Medium 1010 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1010 preferably has a suitable substrate 1011, which may be conventional, and a suitable coating 1012, which may be conventional, usually on one or both sides of substrate 1011.

In the case of a CD-based or DVD-based medium, as is well known, coating 1012 is reflective and is impressed with a plurality of pits 1013, arranged on one or more layers, to encode the machine-executable program. The arrangement of pits is read by reflecting laser light off the surface of coating 1012. A protective coating 1014, which preferably is substantially transparent, is provided on top of coating 1012.

In the case of magneto-optical disk, as is well known, coating 1012 has no pits 1013, but has a plurality of magnetic domains whose polarity or orientation can be changed magnetically when heated above a certain temperature, as by a laser (not shown). The orientation of the domains can be read by measuring the polarization of laser light reflected from coating 1012. The arrangement of the domains encodes the program as described above.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method for coalescing regions on a virtualized programmable logic device, the method comprising:
   configuring a first function on a first subregion on the virtualized programmable logic device,
      wherein the first subregion borders an unused subregion on the programmable logic device; and
   migrating the first function operated on the first subregion to a second function operated on a second subregion on the virtualized programmable logic device; and
   releasing the first subregion from the first function,
      wherein the second function is configured to perform a same task as the first function, and
      wherein the released first subregion and the unused subregion together form a larger unused subregion on the virtualized programmable logic device.

2. The method of claim 1, wherein the first function includes configured programmable circuitry programmed on the first subregion to perform a specific task.

3. The method of claim 1, wherein the migrating is triggered by an external request, or a periodic defragmentation operation.

4. The method of claim 1, further comprising:
   storing, with a memory unit communicatively coupled to the virtualized programmable logic device, state information associated with the first function,
      wherein a first memory address in the memory unit used by the first function is remapped to a second memory address based on a hardware addressing remapping function; and
   connecting, via an interconnect fabric, the second subregion to the memory unit based on the second memory address.

5. The method of claim 4, wherein the interconnect fabric includes a multi-port front end interface.

6. The method of claim 1, further comprising:
   mapping, based on a one-to-one remapping table, a first set of bits configuring the first subregion for the first function to a second set of bits configuring the second subregion for the second function.

7. The method of claim 1, further comprising:
   pausing a physical interface that the first function depends on to communicate with circuitry outside the first subregion through a pause request interface during the migrating.

8. The method of claim 1, wherein configuring the first function on the first subregion comprises:
   configuring an output port for streaming out an internal state associated with the first function; and
   configuring an input port for receiving state information from the second function to migrate from the first function to the second function.

9. The method of claim 1, further comprising:
   connecting, via a host-function interface, the first function and a host driver,
      wherein the host-function interface is blocked during the migrating and is remapped to point to the second function associated with the second subregion once the migrating is complete.

10. A method for migrating a function operating on a subregion to a different subregion in a virtualized programmable logic environment, the method comprising:
    determining a first function associated with a first subregion to be migrated to a second subregion on a programmable logic device;
    loading a second function to the second subregion on the programmable logic device, the second function configured to perform a same task as the first function, wherein loading the second function to the second subregion on the programmable logic device comprises:
       reading a first set of bits out of the first subregion;
       remapping the first set of bits to obtain a second set of bits based on a remapping function; and
       configuring the second subregion with the second set of bits;
    transferring state information associated with the first function to the second function; and
    releasing the first subregion to generate an unused subregion.

11. The method of claim 10, wherein the first function is configured by a first precompiled bitstream when the first function is associated with the first subregion, and the first function is configured by a second precompiled bitstream when the first function is migrated to the second subregion, and
   wherein the loading the second function to the second subregion further comprises programming the second precompiled bitstream into the second subregion.

12. The method of claim 10, further comprising loading static configuration information associated with the first subregion to the second subregion.

13. The method of claim 10, wherein the transferring state information further comprises:
    pausing the first function and respective software drivers to stabilize a state associated with the first function;
    transferring an internal hardware state associated with the first function to the second function;
    transferring an external memory state associated with the first function to the second function;
    transferring a software driver state associated with the first function to the second function; and
    instantiating or resuming an operation of the second function based on the transferred state information.

14. The method of claim 13, wherein the transferring the internal hardware state further comprises:
    sending a first signal to the first subregion to stream the internal hardware state out of the first subregion via a first state stream interface; and
    sending a second signal to the second subregion to stream the internal hardware state into the second subregion via a second state stream interface.

15. The method of claim 13, wherein the transferring the internal hardware state further comprises:
    instantiating a software driver associated with the first function to stream out the internal hardware state via a software application programming interface (API); and
    using the software driver to stream the internal hardware state into the second subregion via the software API.

16. The method of claim 13, wherein the transferring the internal hardware state further comprises:
    remapping the internal hardware state associated with the first subregion to a second internal state associated with the second subregion.

17. The method of claim 13, wherein the transferring the external memory state comprises:

remapping a first memory address in a memory unit used by the first function to a second memory address based on a hardware addressing remapping function; and connecting, via an interconnect fabric, the second function to the memory unit based on the second memory address.

18. The method of claim 13, wherein the transferring software driver state comprises:

configuring a reconfigurable interconnect fabric to connect between a host driver and the first subregion;

pausing the host driver;

disconnecting the interconnect fabric from the first subregion;

connecting the interconnect fabric to the second subregion; and restarting the host driver.

19. A processor-readable non-transitory medium storing processor-executable instructions for coalescing regions on a virtualized programmable logic device, the processor-executable instructions comprising:

instructions executable by a processor to configure a first function on a first subregion on the programmable logic device, wherein the first function borders an unused subregion on the programmable logic device; and instructions executable by the processor to configure a host driver to migrate the first function operated on the first subregion to a second function operated on a second subregion on the programmable logic device, and release the first subregion, wherein the second function is configured to perform a same task with the first function, and wherein the first subregion and the unused subregion form a larger unused subregion on the programmable logic device.

* * * * *